United States Patent [19]

Matheron et al.

[11] Patent Number: 4,570,087
[45] Date of Patent: Feb. 11, 1986

[54] JOSEPHSON DIODE LOGIC DEVICE

[75] Inventors: Gérard Matheron, Echirolles; Philippe Migny, Seyssins; Bernard Placais, Rueil, all of France

[73] Assignee: Commissariat a l'Energie Atomique, Paris, France

[21] Appl. No.: 504,328

[22] Filed: Jun. 14, 1983

[30] Foreign Application Priority Data

Jun. 14, 1982 [FR] France ................................. 82 10316

[51] Int. Cl.[4] .......................................... H03K 19/195
[52] U.S. Cl. .................................. 307/462; 307/476; 307/306
[58] Field of Search ....................... 307/462, 476, 306; 357/5; 365/162

[56] References Cited

U.S. PATENT DOCUMENTS 4,371,796 2/1983 Takada ................................. 307/462

FOREIGN PATENT DOCUMENTS 2078046 12/1981 United Kingdom .

OTHER PUBLICATIONS

IBM Technical Disclosure Bulletin, vol. 24, No. 3, Aug. 1981, S. M. Faris et al., pp. 1545–1546.
Japan Journal of Applied Physics, vol. 19, Suppl. 19-1, 1980, S. Takada et al., pp. 607–611.
International Electron Devices Meeting, Dec. 7–9, 1981, T. C. Wang et al., pp. 118–121.

Primary Examiner—John Zazworsky
Attorney, Agent, or Firm—Pearne, Gordon, Sessions, McCoy, Granger & Tilberry

[57] ABSTRACT

Current injection logic device with a system of Josephson diodes.

This system is constituted by N parallel branches, each having a first and a second Josephson diode in series, so as to provide a connection. All the first and second diodes are respectively connected to first and second main electrodes, the second electrode being earthed. The device also has M current inputs, respectively connected to M of the connections and an output connected to the first main electrode and which is to be raised to a logic level determined as a function of the values of currents injected by the inputs. In each branch provided with a current input, one or other of the diodes is shunted by a resistor, as a function of the envisaged application.

8 Claims, 7 Drawing Figures

JOSEPHSON DIODE LOGIC DEVICE

BACKGROUND OF THE INVENTION

The present invention relates to a current injection logic device with a network of Josephson diodes, also called Josephson junctions. It more particularly applies to the construction of AND or OR logic gates, which can in particular be used for producing cryogenic computers.

It is known that the operating margins relative to control currents of Josephson diode logic devices play an important part in the design of logic circuits.

Different groups of Josephson logic devices are described in the article by T. GHEEWALA, entitled "Josephson logic devices and circuits" and published in the Journal IEEE Transactions on Electronic Devices, Vol. ED 27, 1980, pp. 1857 to 1869.

One of the groups is constituted by interferometric current injection logic devices and within this group devices are known having three Josephson diodes, which make it possible to produce AND-type logic gates. These devices are described in the article by H. BEHA et al entitled "High-Tolerance Three-Josephson-Junction Current-Injection Logic Devices (HTCID)", and published in the Journal IEEE Transactions on Magnetics, Vol. Mag-17, No.6, November 1981, pp. 3423 to 3425. These devices have high performance levels with regards to their speed and operating margins on the control current. However, they comprise loops having inductances, which have a function in such devices and consequently have the disadvantage of taking up a large amount of space, which is prejudicial to their use for producing integrated logic circuits.

SUMMARY OF THE INVENTION

The object of the present invention is to obviate this disadvantage.

The present invention specifically relates to a Josephson junction logic device comprising a first main electrode and a second main electrode which is earthed; a system of Josephson diodes constituted by N branches connected in parallel and each having a first and a second Josephson diode connected in series, N being an integer at least equal to 3, each first Josephson diode having on one side a connection to the second Josephson diode of the branch to which it belongs, whilst on the other side being connected to the first main electrode, whilst each second Josephson diode is connected on one side to the first Josephson diode of the branch to which it belongs, whilst being connected on the other side to the second main electrode; M inputs respectively connected to M of the said connections and serving for the injection of electrical currents into the said system, M being an integer at least equal to 2 and less than the number N, each of the connections associated with the M inputs being connected to one of the main electrodes via a shunt resistor supplying to the main electrode a current injected by the input corresponding to said connection, when said current passes the two Josephson diodes with the said connection between them into a non-zero voltage state; and an output connected to the first main electrode and which is to be raised to a given logic level, as a function of the values of said currents.

As a function of the values of said currents, the different Josephson diodes either switch or do not switch, i.e. they pass from a zero voltage state with a purely reactive impedance, to a non-zero voltage state with a high impedance, or remain in the zero voltage state. Under these conditions, the said output can remain at logic level zero and no current is supplied to said output, or can be raised to logic level 1, when a current is supplied to said output. With the aid of the logic device according to the invention, it is thus possible to form, inter alia, logic gates of the AND type, or the OR type, having M inputs.

In particular, it is possible to produce AND gates, each consisting of a cell having two inputs and 6 Josephson diodes, whose performance levels both with regards to the operating margins and with regards to their dynamics, are at least as good as those of the devices described in the aforementioned article and whose inductances do not have a functional part to play and which can therefore be minimized by a highly integrated design of said cell. This design has the advantage of reducing the switching time and increasing the possibilities of integration of the gates in question.

Moreover, the device according to the invention makes it possible to produce, in a single cell, a logic gate having more than two inputs, e.g. three or four inputs, whereas the technology based on the use of interferometers required at least two cells to arrive at the same result. In the case of gates having more than two inputs, the invention consequently permits a greater integration and an even higher switching speed, compared with the prior art devices described in the article referred to hereinbefore.

A polarization current can be injected into the system of Josephson diodes by means of the first main electrode.

In the case of logic gates of the AND type, the injection of the polarization current makes it possible to increase the gain of said gates. Moreover, as a function of the values of the polarization current and depending on the positions of the shunt resistors, it is possible to produce logic functions of a more general type than the AND and OR functions, e.g. exclusive-OR functions.

According to an embodiment of the device according to the invention, in each branch, the first and second Josephson diodes both have the same critical current for reasons of operational symmetry of the device and consequently the symmetry in the use of the different inputs.

According to yet another feature of the invention, the Josephson diodes of the branches associated with the M inputs all have the same critical current $I_o$, the first and second Josephson diodes of each of the N-M remaining branches have the same critical current and, for these N-M remaining branches, the sum of the critical currents of the first Josephson diodes and the sum of the critical currents of the second Josephson diodes are both equal to $nI_o$, n being a number exceeding 1. Preferably, the number n is equal to $2M-1$.

The number M can be equal to $N-1$. In other words, the device according to the invention can have M branches, respectively associated with M inputs and another branch to which leads no input. According to a special embodiment of the invention, the Josephson diodes having the M branches all have the same critical current $I_o$ and the two Josephson diodes forming the other branch both have a critical current equal to $nI_o$. Moreover, and particularly in the case where M is an uneven number, for the reasons of symmetry referred to hereinbefore, it is possible to have a device in which the Josephson diodes forming the branches associated with the M inputs all have the same critical current $I_o$ and comprises, for example, 2K other branches, whereof each Josephson diode has a critical current equal to $nI_o/(2K)$, K being an integer at least equal to 1.

According to another embodiment of the device according to the invention, as the device is intended to form an AND gate, each of the connections associated with the M inputs is connected to the first main electrode via the shunt resistor corresponding to said connection, said shunt resistor being of a lower level than the leakage resistor of the second Josephson diode associated with said connection.

According to another embodiment, the output of the device according to the invention is closed on the characteristic impedance of the said output, so that each of the shunt resistors is equal to or lower than the resistance equivalent to said characteristic impedance. This equivalent resistance is itself lower than the leakage resistance of each of the Josephson diodes of the branches corresponding to the inputs.

According to another feature of the invention, a polarization current is injected, by means of the first main electrode, into the AND gate in question, so as to increase the gain of the latter.

Finally, according to yet another feature of the invention, in which the device according to the invention is intended to constitute an OR gate and the output of said device is closed on the characteristic impedance of said output, each of the connections associated with the M inputs is connected to the second main electrode via the shunt resistor corresponding to said connection, said shunt resistor having a lower level than the resistance equivalent to the characteristic impedance (said equivalent resistance being itself lower than the leakage resistance of each of the Josephson diodes of the branches corresponding to the inputs), a polarization current being injected, via the first main electrode, into the OR gate in question and the intensity $I_P$ of said current satisfies the following inequation:

$$(M+n-1) I_o < I_P < (M+n)I_o$$

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
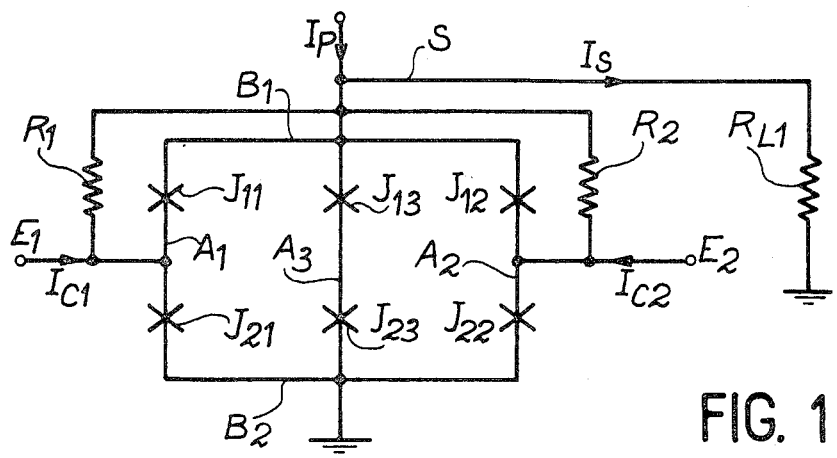
FIG. 1 a diagrammatic view of a special embodiment of the device according to the invention having six Josephson diodes and constituting a logic AND gate with two inputs, the four diodes associated with the inputs all having the same critical current $I_o$ and the two other diodes both having a critical current equal to $nI_o$.

FIG. 1 diagrammatically shows a special embodiment of the device according to the invention, constituting an AND gate with two inputs. It comprises a system of Josephson diodes, constituted by three branches connected in parallel and each having a pair of Josephson diodes connected in series and thus having a connection. In each pair, the first and second diodes have a common electrode. More specifically, the AND gate in question has three pairs of first and second Josephson diodes $(J_{11}, J_{21})$, $(J_{12}, J_{22})$ and $(J_{13}, J_{23})$. The first diodes $J_{11}$, $J_{12}$ and $J_{13}$ are connected on the one side to a first main electrode $B_1$ and on the other respectively to electrodes $A_1$, $A_2$ and $A_3$. The second diodes $J_{21}$, $J_{22}$ and $J_{23}$ are connected on one side to a second main electrode $B_2$ and on the other side, respectively to electrodes $A_1$, $A_2$ and $A_3$. The second main electrode $B_2$ is earthed.

The AND gate also comprises two inputs $E_1$ and $E_2$ respectively connected to electrodes $A_1$ and $A_2$ and serving to respectively receive the electrical control currents $I_{C1}$, $I_{C2}$ of the AND gate. The latter also has an output S connected to the first main electrode $B_1$. This output is also loaded by its characteristic impedance with an equivalent resistance $R_{L1}$. In addition, electrodes $A_1$ and $A_2$ are connected to the first main electrode $B_1$, respectively by shunt resistors $R_1$ and $R_2$, which are respectively smaller and preferably 10 times smaller than the leakage resistors or internal shunt resistors of diodes $J_{21}$ and $J_{22}$ and are also smaller than the equivalent resistance $R_{L1}$.

For reasons of symmetry with respect to the injected control currents, the Josephson diodes $J_{1i}$ and $J_{2i}$ are constructed in such a way that their respective critical currents $I_{1i}^o$ and $I_{2i}^o$ are equal, i varying between 1 and 3. Preferably, diodes $J_{11}$, $J_{21}$, $J_{12}$ and $J_{22}$ are such that they have the same critical current $I_o$ and the diodes $J_{13}$ and $J_{23}$ are such that they both have a critical current equal to $nI_o$, n being a number exceeding 1 and preferably equal to 3, as will be shown hereinafter. Moreover, to have a symmetry in the structure of the AND gate, the branch $B_1A_3B_2$ with the diodes $J_{13}$ and $J_{23}$ can be arranged between branches $B_1A_1B_2$ and $B_1A_2B_2$ respectively having the pair of diodes $J_{11}$, $J_{21}$ and $J_{12}$, $J_{22}$, as has been seen in FIG. 1.

The operation of the device shown in FIG. 1 is as follows. In the initial state of the device, 6 Josephson diodes are superconducting. Output S is at logic state 0, no current being supplied thereto. Under the effect of a control current of intensity $I_{C1}$ exceeding $2I_o$, injected by input $E_1$ into the device, diodes $J_{11}$ and $J_{21}$ switch from a zero voltage state to a non-zero voltage state corresponding to a high impedance state. Current $I_{C1}$, injected into electrode $A_1$, is then deflected, via shunt resistor $R_1$, towards the first main electrode $B_1$, from which it is distributed into the two branches $B_1A_2B_2$ and $B_1A_3B_2$ output S remaining at logic state 0.

Under the action of another control current of intensity $I_{C2}$, exceeding $2I_o$ and injected by input $E_2$ into the device, diodes $J_{12}$ and $J_{22}$ successively switch and current $I_{C2}$, injected into electrode $A_2$, is then deflected via shunt resistor $R_2$, towards the first main electrode $B_1$, from which it is distributed in the branches $B_1A_1B_2$ and $B_1A_3B_2$. The output S still remains at logic state 0 in this case. However, under the combined effects of currents $I_{C1}$ and $I_{C2}$, diodes $J_{11}$, $J_{21}$, $J_{22}$ and $J_{12}$ switch, the currents $I_{C1}$ and $I_{C2}$ then being deflected, respectively via shunt resistors $R_1$, $R_2$ towards the first main electrode $B_1$ and diodes $J_{13}$ and $J_{23}$ thus switch into a non-zero voltage state. Consequently, currents $I_{C1}$ and $I_{C2}$ are deflected towards output S, to produce there an output current $I_S$. This output then passes to logic state 1.

Thus, the device shown in FIG. 1 functions as an AND gate having a gain $I_S/I_{C1}$ (or $I_S/I_{C2}$) close to 2 and permits high operating margins. To obtain a higher gain, it is merely necessary to polarize, the AND gate by injecting a current $I_P$ into the first main electrode $B_1$.

Figure 2:
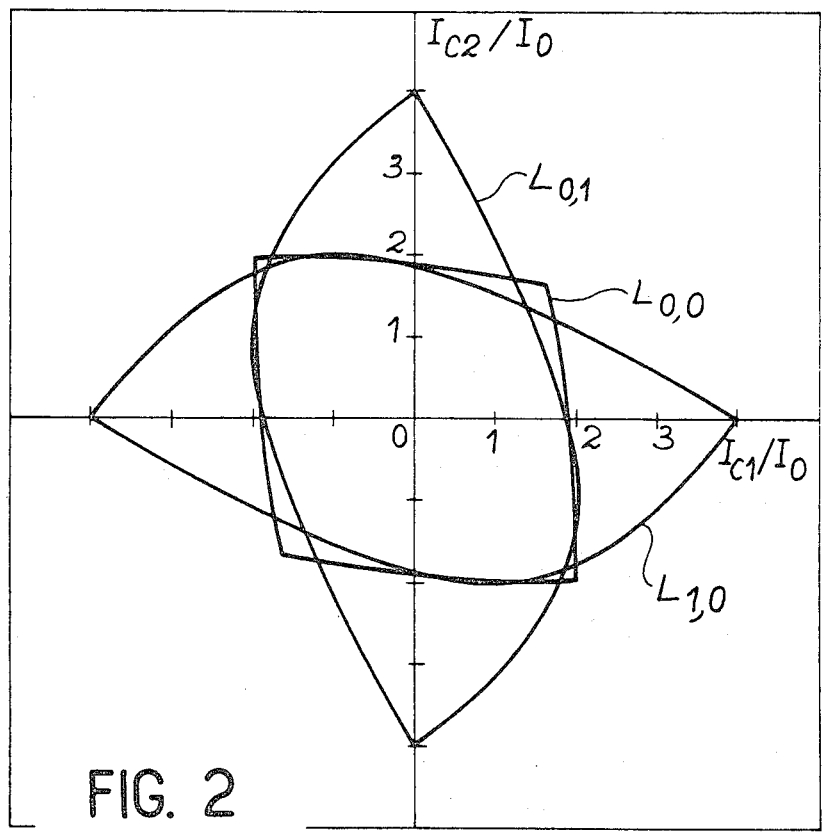
FIG. 2 a diagram showing the different zones respectively corresponding to the switching of certain Josephson diodes of the device shown in FIG. 1, as a function of the values of the control currents respectively injected at the inputs, the number N being equal to 3.

In FIG. 2, as a function of the values of $I_{C1}/I_o$ (plotted on the abscissa) and the values of $I_{C2}/I_i$ (plotted on the ordinate), the limits of the zones corresponding to the different states are plotted and are defined hereinafter for the Josephson diodes of the AND gate of FIG. 1, the number N being equal to 3. These limits or lobes are respectively designated $L_{0.0}$, $L_{0.1}$ and $L_{1.0}$. Lobe $L_{0.0}$, which has the first bisector as the axis of symmetry, defines a zone corresponding to the values of $I_{C1}$ and $I_{C2}$ for which the 6 Josephson diodes are in the superconducting state. Lobe L1.0 (respectively $L_{0.1}$) defines a zone corresponding to the values of $I_{C1}$ and $I_{C2}$ for which the diodes $J_{11}$ and $J_{21}$ (respectively $J_{12}$ and $J_{22}$) have switched and for which the four remaining diodes remain in the superconducting state. Lobes $L_{1.0}$ and $L_{0.1}$ are symmetrical with respect to the first bisector.

Figure 3:
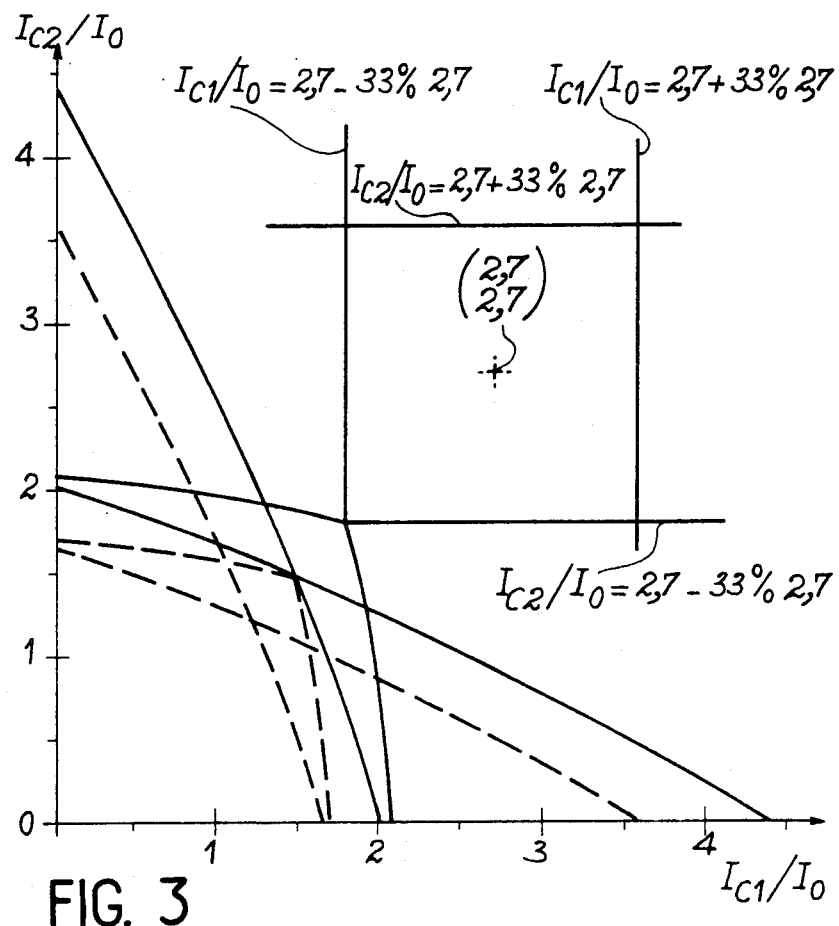
FIG. 3 a diagram showing the operating margins of the device shown in FIG. 1, for tolerances of ±10% on the critical currents of the Josephson diodes used, the number N being equal to 3.

In FIG. 3, as a function of the positive values of $I_{C1}/I_o$ (plotted on the abscissa) and the positive values of $I_{C2}/I_o$ (plotted on the ordinate) the operating margins as an AND gate of the device of FIG. 1 are plotted for tolerances of $\pm 10\%$ on the critical currents of the Josephson diodes used, the number N still being equal to 3. FIG. 3 shows two homologous groups of lobes as defined hereinbefore, in which the first group, indicated by broken lines, corresponds to diodes $J_{11}$, $J_{21}$, $J_{12}$ and $J_{22}$, whose critical currents are equal to $(I_o - 10\%I_o)$ and the second group, in continuous lines, correspond to diode $J_{11}$, $J_{21}$, $J_{12}$ and $J_{22}$, whose critical currents are equal to $(I_o + 10\%I_o)$. The operating margins on the control currents $I_{C1}$ and $I_{C2}$ are given by a square, which is defined by the intersection of the equation lines:

$$I_{C1}/I_o = 2.7 \pm 0.9 \text{ and } I_{C2}/I_o = 2.7 \pm 0.9.$$

Thus, the invention makes it possible to produce an AND gate, whose operating margins on the control currents exceed $\pm 30\%$, by accepting tolerances of $\pm 10\%$ on the critical currents.

Figure 4:
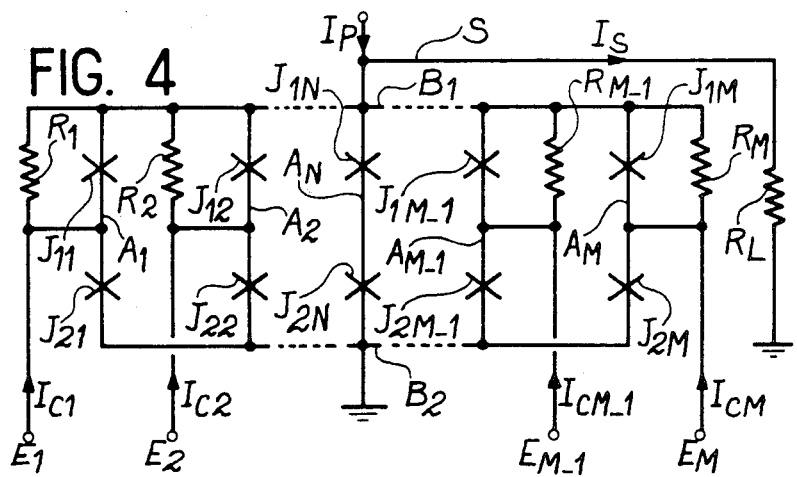
FIG. 4 a diagrammatic view of another embodiment of the device according to the invention, having two N Josephson diodes, N being e.g. equal to 5, and constituting a logic AND gate with M inputs, M being e.g. equal to 4.

FIG. 4 diagrammatically shows another embodiment of the device according to the invention, with 2N Josephson diodes and constituting a logic AND gate with M inputs, with:

$N \geq 3$ and $2 \leq M < N$.

For information purposes, FIG. 4 shows an example in which the numbers M and N are respectively equal to 4 and 5.

The embodiment of FIG. 4 comprises a system of Josephson diodes constituted by N branches connected in parallel and each having first and second Josephson diodes connected in series and thus having a connection. More specifically, the AND gate of FIG. 4 comprises N pairs of first and second Josephson diodes $(J_{11},J_{21}) \ldots (J_{1M},J_{2M}) \ldots (J_{1N}, J_{2N})$. In a non-limitative manner, it is assumed that M is equal to N−1. The N first diodes $J_{11},J_{12} \ldots J_{1N}$ are connected on one side to a first main electrode $B_1$ and on the other side respectively to electrodes $A_1, A_2 \ldots A_N$. The N second Josephson diodes $J_{21}, J_{22} \ldots J_{2N}$ are connected on one side to a second main electrode $B_2$ and on the other, respectively to electrodes $A_1, A_2 \ldots A_N$, the second main electrode $B_2$ being earthed.

The AND gate, shown in FIG. 4, also has M inputs $E_1, E_2 \ldots E_M$, which are respectively connected to electrodes $A_1, A_2 \ldots A_M$ and which serve to respectively receive control currents $I_{C1}, I_{C2} \ldots I_{CM}$ from the AND gate. The latter also has an output S, which is connected to the first main electrode $B_1$, output S is also closed on its characteristic impedance, of equivalent resistance $R_L$. Moreover, electrodes $A_1, A_2 \ldots A_M$ are connected to the first main electrode $B_1$, respectively by the shunt resistors $R_1, R_2 \ldots R_M$, which are respectively smaller and preferably at least 10 times smaller than the leakage resistors of the Josephson diodes $J_{21}$, $J_{22} \ldots J_{2M}$ and are also smaller than the equivalent resistance $R_L$.

For reasons of symmetry with respect to the injected control currents, the Josephson diodes $J_{1i}$ and $J_{2i}$ are constructed such that their respective critical currents $I_{1i}{}^o$ and $I_{2i}{}^o$ are equal, i varying between 1 and N. Preferably, diodes $J_{1i}$ and $J_{2i}$, i varying between 1 and N, are constructed in such a way that they have the same critical current $I_o$ and diodes $J_1N$ and $J_2N$ are constructed in such a way that they both have a critical current equal to $nI_o$, n being a number greater than 1, whose preferred value will subsequently be determined.

The operation of the AND gate shown in FIG. 4 is comparable to that of the AND gate of FIG. 1. As soon as a control current $I_{C1}$ has switched the corresponding Josephson diodes $J_{1i}$ and $J_{2i}$, it is reinjected, via shunt resistor $R_1$, into the first main electrode $B_1$ and serves as a polarization current with respect to the other current inputs. In the initial state, all the Josephson diodes are superconducting. Output S is at logic state 0, no current being supplied to said output. The injection of at the most M−1 control currents of intensity greater than $2I_o$ leads to no change of logic state of the output, but the injection of M control currents of intensities higher than $2I_o$ leads to output S passing to logic state 1, a current $I_S$ then being supplied to said output. In order to increase the gain of the AND gate shown in FIG. 4, it is obviously possible to inject a polarization $I_P$ into it, via the first main electrode $B_1$.

The logic level 0 of an input is defined by the fact that the intensity $I_{Ci}$ of the current reaching it is well below $2I_o$. The logic level 1 of said input is also defined by the fact that the intensity $I_{Ci}$ of the current reaching it satisfies the following double inequation, in which $\Delta$ is a positive number:

$$2I_o < I_{Ci} < (2+\Delta)I_o \qquad (1)$$

In order that the device shown in FIG. 4 effectively functions as an AND gate, it is firstly necessary for the output to be at logic level 0, when M−1 inputs are at logic level 1 and one input is at logic level 0. In other words, it is necessary that the sum of the intensities of the $M-1$ control currents corresponding to these $M-1$ inputs at logic level 1 is below $(n+1)I_o$. For this purpose, it is merely necessary in accordance with the double inequation (1), to have:

$$(M-1)(2+\Delta)I_o < (n+1)I_o$$

Thus, it is merely necessary for the following condition to be satisfied:

$$(M-1)(2+\Delta) > n+1 \quad (2)$$

It is also necessary that the output is at logic level 1, when the M inputs are at logic level 1. Bearing in mind the double inequation (1), for this it is merely necessary to have:

$$2MI_o > nI_o$$

It is therefore sufficient if the following condition is satisfied:

$$2M > n \quad (3)$$

In order to have an appropriate operation of the device of FIG. 4 as an AND gate, it is consequently possible to choose the number n equal to $2M-1$, bearing in mind condition (3). However, bearing in mind condition (2), it is then necessary for the following inequation to be satisfied:

$$(M-1)(2+\Delta) < 2M$$

i.e.

$$\Delta < 2/(M-1)$$

The operating margins of the device of FIG. 4 as an AND gate, expressed as a percentage, written: $\delta = (1+4/\Delta)^{-1}$ are then equal to:

$$\delta = 1/(2M-1) \quad (4)$$

On considering an AND gate with $M_1$ inputs, polarized by a current $I_P$ so as to have a gain G higher than $M_1$ and e.g. such that:

$$G = M_1 + M_2$$

the number $M_2$ being an integer, for calculating the operating margin $\delta$ expressed as a percentage, of such an AND gate, to calculate the operating margins of an AND gate with $M_1 + M_2$ inputs, which is not polarized. The polarization current $I_P$ to be applied to the AND gate with $M_1$ inputs is then such that:

$$M_2 I_{Co}(1-\delta) < I_P < M_2 I_{Co}(1+\delta)$$

with, in accordance with equation (4):

$$\delta 1/(2M_1 + 2M_2 - 1).$$

Moreover, the current $I_{Co}$ is defined by:
$$I_{Co}(1-\delta) < I_{Ci} < I_{Co}(1+\delta)$$

for an input reached by a current of intensity $I_{Ci}$, raising said input to logic level 1.

Thus, by comparison with the double inequation (1), $$I_{Co} = 2I_o/(1-\delta)$$

or, whilst taking account of equation (4):

$$I_{Co} = I_o(2M-1)/(M-1)$$

with, in the present case: $M = M_1 + M_2$.

The approximate values of $\delta$ are given in the following table, as a function of the numbers $M_1$ and $M_2$:

| $M_2$ | $M_1$ | 2 | 3 | 4 |
|---|---|---|---|---|
| 0 | | 30% | 20% | 15% |
| 1 | | 20% | 15% | 10% |
| 2 | | 15% | 10% | 7% |
| 3 | | 10% | 7% | 5% |

Figure 5:
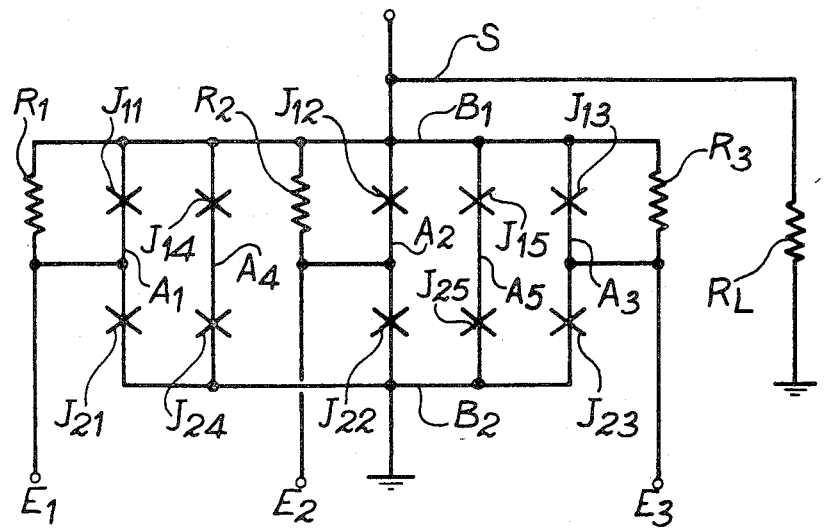
FIG. 5 a diagrammatic view of another special embodiment, constituting a logic AND gate with three inputs.

It is obviously possible to have an AND gate with more than one branch not provided with an input. This is diagrammatically shown in FIG. 5, using the example of an AND gate with three inputs (M=3) and five branches (N=5). The 2M (i.e. six) Josephson diodes $J_{ij}$, with i equal to 1 or 2 and j varying between 1 and 3, said diodes corresponding to inputs $E_1$, $E_2$ and $E_3$, in such a way that they all have the same critical current $I_o$ and the two (N−M), i.e. four other Josephson diodes $J_{14}$, $J_{24}$, $J_{15}$ and $J_{25}$ are formed in such a way that they all have the same critical current equal to $nI_o/2$, n preferably being equal to $2M-1$, i.e. 5. Thus, these four diodes distributed over two branches are equivalent to two diodes in series on a single branch and having critical currents $nI_o$.

Figure 6:
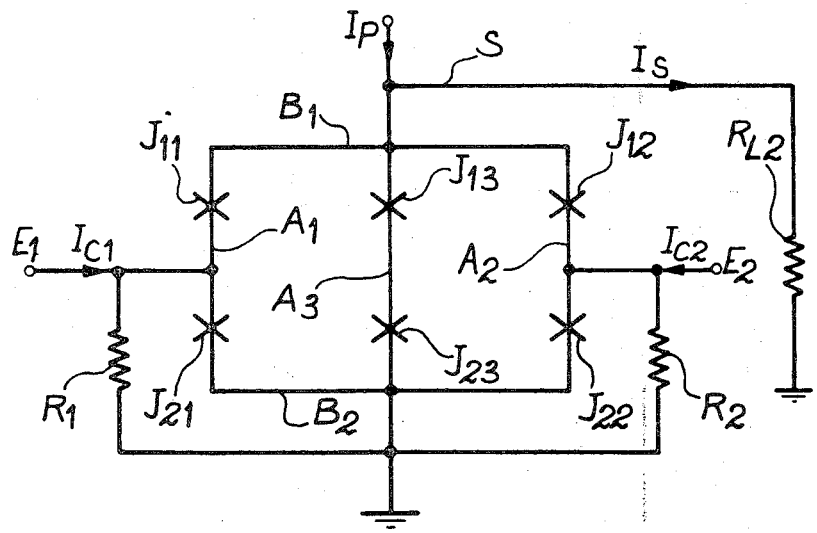
FIG. 6 a diagrammatic view of an embodiment of the invention with 6 Josephson diodes and constituting a logic OR gate with two inputs.

In FIG. 6, is diagrammatically shown a special embodiment of the device according to the invention, having six Josephson diodes and constituting an OR gate with two inputs $E_1$ and $E_2$. The system constituted by these 6 Josephson diodes is identical to the system of Josephson diodes forming part of the AND gate of FIG. 1. The two inputs respectively make it possible to inject currents $I_{C1}$ and $I_{C2}$ into electrodes $A_1$ and $A_2$. The second main electrode $B_2$ is earthed. Output S is closed on its characteristic impedance of equivalent resistance $R_{L2}$. The embodiment shown in FIG. 6 also has two shunt resistors $R_1$ and $R_2$, but they are connected differently to the connection arrangement described relative to FIG. 1. Resistors $R_1$ and $R_2$ respectively connect electrodes $A_1$ and $A_2$ to the second main electrode $B_2$. Moreover, these resistances are lower than the equivalent resistor $R_{L2}$ and are preferably 8 to 10 times lower than $R_{L2}$. Moreover, the OR gate of FIG. 6 is polarized by a current of intensity $I_P$, injected into said gate by the first main electrode $B_1$ and such that the intensity $I_P$ satisfies the following double inequation, which will be explained hereinafter:

$$(1+n)I_o < I_P < (2+n)I_o$$

$I_o$ being equal, as in the case of FIG. 1, to the critical current of the Josephson diodes $J_{11}$, $J_{21}$, $J_{12}$ and $J_{22}$, and $nI_o$ being equal to the critical current of Josephson diodes $J_{13}$ and $J_{23}$.

The device according to FIG. 6 operates as follows. In the initial state, all the Josephson diodes are superconducting. No current is supplied to output S, which is thus at logic level 0 and remains there for as long as no current is injected into the device by at least one of the electrodes $A_1$ and $A_2$ (or whilst the intensity of the currents injected by these electrodes remains close to zero and well below $I_o$). When a control current of intensity greater than $I_o$, is injected into the device by at least one of the two electrodes $A_1$ and $A_2$, said current switches the two Josephson diodes of branch $B_1A_1B_2$ (or $B_1A_2B_2$) reached by it and is thus passed to the second main electrode $B_2$ and consequently to earth, via one of the two shunt resistors $R_1$ and $R_2$. The polarization current, of intensity higher than $(1+n)I_o$, then switches the Josephson diodes $J_{13}$ and $J_{12}$ (or $J_{13}$ and $J_{11}$) after which it is passed into output S to form the output current $I_S$. Thus, the output is raised to logic level 1. The device shown in FIG. 6 consequently functions as an OR gate. The main advantage of such an OR gate compared with those of the prior art, is the electrical insulation between the two inputs $E_1$ and $E_2$ (whereas in the known OR gates, these two inputs are connected to a single electrode). Obviously, the OR gate of FIG. 6 also permits electrical insulation between its inputs and its output.

Figure 7:
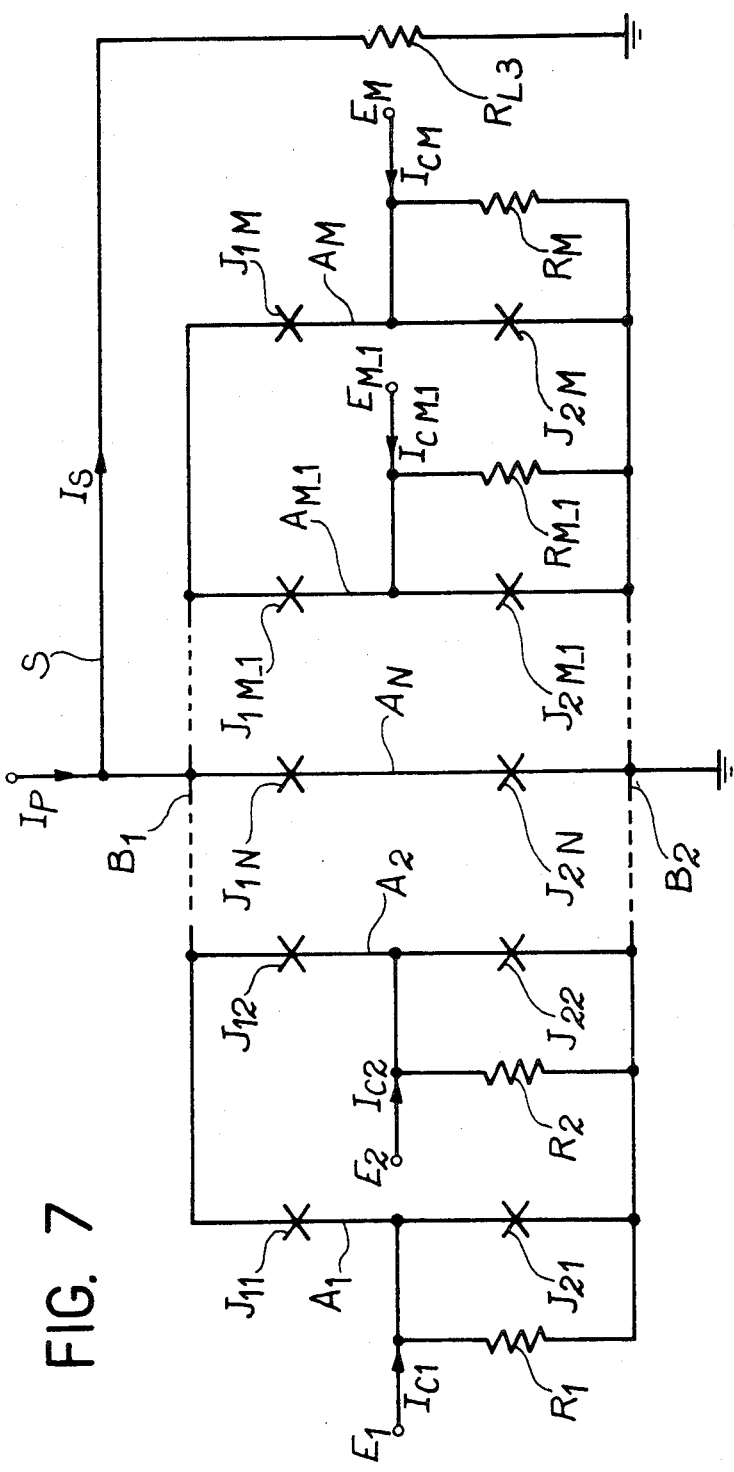
FIG. 7 a diagrammatic view of another embodiment of the invention with 2N Josephson diodes, N being e.g. equal to 4 and constituting a logic OR gate with M inputs, M being e.g. equal to 4.

FIG. 7 diagrammatically shows an embodiment of the device according to the invention, constituting an OR gate with M inputs, M being e.g. equal to 4, and N branches, N being e.g. then equal to 5. The system of Josephson diodes forming part of this special embodiment is identical to that forming part of the AND gate shown in FIG. 4 and that has N branches connected in parallel, each with two Josephson diodes connected in series, with:

$N \geq 3$ and $2 \leq M < N$.

The M inputs $E_1$, $E_2$ ... $E_M$ are connected to the M electrodes $A_1$, $A_2$ ... $A_M$. Output S is closed on its characteristic impedance of equivalent resistance $R_{L3}$ and is connected to the first main electrode $B_1$. The OR gate shown in FIG. 7 has M shunt resistors $R_1$, $R_2$ ... $R_M$, whose connection differs from that of FIG. 4. These M resistors of the OR gate of FIG. 7 respectively connect the M inputs $E_1$, $E_2$ ... $E_M$ to the second main electrode $B_2$, which is earthed. These resistors are also below the equivalent resistance $R_{L3}$ and are preferably 8 to 10 times lower than $R_{L3}$. Moreover, the OR gate is polarized by a current of intensity $I_P$, injected by the first main electrode $B_1$. The intensity $I_P$ satisfies the following double inequation:

$$(M=n-1)I_o < I_P < (M+n)I_o \qquad (5)$$

It is pointed out that the Josephson diodes $I_{ij}$, i being equal to 1 or 2 and j varying from 1 to M, all have the same critical current $I_o$, that the two Josephson diodes $J_1N$ and $J_2N$ both have a critical current equal to $nI_o$ and that, in an informative and non-limitative manner, M is e.g. equal to $N-1$.

The device shown in FIG. 7, which is a simple generalization of the operation of the device shown in FIG. 6, is that of an OR gate. The double inequation (5) results from the conditions required for an OR gate operation. On the one hand there must not be there an output signal when all the control currents $I_{C1}$, $I_{C2}$ ... $I_{CN}$ are zero, which requires:

$$I_P < (M+n)I_o \qquad (6)$$

On the other hand, when at least one control current $I_{C1}$, $I_{C2}$ ... or $I_{CM}$ of intensity exceeding $I_o$, is injected into the device, it is necessary for there to be an output signal, which implies:

$$I_P > (M+n-1)I_o \qquad (7)$$

The combination of conditions (6) and (7) gives the double inequation (5). With the aid thereof, it can also be seen that the operating margin $\delta$ as an OR gate of the device of FIG. 7, and which relates to the polarization current $I_P$ expressed as a percentage, are given by:

$$\delta = (2(M+n)-1)^{-1}$$

For example, when M and n are respectively equivalent to 2 and 1, $\delta$ is approximately 20%.

Obviously, as has already been pointed out, in place of a single branch, it is also possible to have several branches in parallel, which are not associated with inputs ($N-M$ then exceeding 1) and provided with Josephson diodes, whose critical currents are all equal to the same value $I_m$, such that:

$$I_m = nI_o/(N-M)$$

Moreover, the device according to the invention, makes it possible to produce more complex logic functions than AND and OR functions, in accordance with the position of the shunt resistors and the values of the polarization current intensities. For example, with the configuration of FIG. 7 and three inputs respectively allocated to logic variables A, B and C (assuming the value 0 or 1), the logic function f is obtained, such that $$f(A,B,C) = A.B + B.C + C.A$$

when the intensity $I_P$ of the polarization current satisfies the relation:

$$(n+1)I_o < I_P < (n+2)I_o$$

The practical realization of the devices according to the invention can be determined by the Expert on the basis of the preceding description and the attached drawings.

What is claimed is:

1. A Josephson junction logic device comprising a first main electrode and a second main electrode which is grounded; a system of Josephson diodes constituted by N branches connected in parallel and each having a first and a second Josephson diode connected in series, N being an integer at least equal to 3, each first Josephson diode having one side connected to the second Josephson diode of the branch to which it belongs, the other side of the first Josephson diode being connected to the first main electrode, each second Josephson diode being connected on one side to the first Josephson diode of the branch to which it belongs, the other side of each second Josephson diode being connected to the second main electrode; M inputs respectively connected to M of connections between said first and second Josephson diodes and serving for the injection of electrical currents into the said system, M being an integer at least equal to 2 and less than the number N, each of the connections associated with the M inputs being connected to one of the main electrodes via a shunt resistor supplying to the main electrode a current injected to the input corresponding to said connection, when said current passes the two Josephson diodes with the said connection between them into a non-zero voltage state; and an output connected to the first main electrode and which is to be raised to a given logic level, as a function of the values of said currents.

2. A logic device according to claim 1, wherein in each branch, the first and second Josephson diodes both have the same critical current.

3. A logic device according to claim 2, wherein the Josephson diodes of the branches associated with the M inputs all have the same critical current $I_o$, the first and second Josephson diodes of each of the N−M remaining branches have the same critical current and, for these N−M remaining branches, the sum of the critical currents of the first Josephson diodes and the sum of the critical currents of the second Josephson diodes are both equal to $nI_o$, n being a number exceeding 1.

4. A logic device according to claim 3, wherein the number n is equal to 2M−1.

5. A logic device according to claim 1, wherein as the device is intended to form an AND gate, each of the connections associated with the M inputs is connected to the first main electrode via the shunt resistor corresponding to said connection, said shunt resistor being of a lower level than the leakage resistor of the second Josephson diode associated with said connection.

6. A logic device according to claim 5, wherein, as its output is loaded by a characteristic impedance of the said output, each of the shunt resistors is equal to or lower than an equivalent resistance at such characteristic impedance.

7. A logic device according to claim 5, wherein a polarization current is injected via the first main electrode into the AND gate in question, in order to increase the gain of the latter.

8. A logic device according to claim 3, wherein, said device serving to constitute an OR gate and the output thereof being loaded by a characteristic impedance of said output, each of the connections associated with the M inputs is connected to the second main electrode via the shunt resistor corresponding to said connection, said shunt resistor being smaller than the equivalent resistance at the characteristic impedance, wherein a polarization current is injected via the first main electrode into the OR gate in question and wherein the intensity of said current satisfies the following double inequation:

$$(M+n-1)I_o < I_P < (M+n)I_o$$

* * * * *